US008675438B2

(12) United States Patent
Noh et al.

(10) Patent No.: US 8,675,438 B2
(45) Date of Patent: Mar. 18, 2014

(54) METHODS OF OPERATING DRAM DEVICES HAVING ADJUSTABLE INTERNAL REFRESH CYCLES THAT VARY IN RESPONSE TO ON-CHIP TEMPERATURE CHANGES

(71) Applicants: Kwang Sook Noh, Hwaseong-si (KR); Young Hun Seo, Suwon-si (KR); Jong Hyun Choi, Suwon-si (KR)

(72) Inventors: Kwang Sook Noh, Hwaseong-si (KR); Young Hun Seo, Suwon-si (KR); Jong Hyun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/017,080

(22) Filed: Sep. 3, 2013

(65) Prior Publication Data

US 2014/0016424 A1 Jan. 16, 2014

Related U.S. Application Data

(60) Continuation of application No. 13/471,592, filed on May 15, 2012, now Pat. No. 8,537,633, which is a division of application No. 12/941,500, filed on Nov. 8, 2010, now Pat. No. 8,218,137, which is a division of application No. 12/111,468, filed on Apr. 29, 2008, now Pat. No. 7,843,752.

(30) Foreign Application Priority Data

Apr. 30, 2007 (KR) .......................... 10-2007-0041735

(51) Int. Cl.
*G11C 7/00* (2006.01)

(52) U.S. Cl.
USPC ....................... 365/222; 365/185.25; 365/211

(58) Field of Classification Search
USPC ......................................................... 365/222
See application file for complete search history.

(56) References Cited

U.S. PATENT DOCUMENTS

| 5,278,796 | A | 1/1994 | Tillinghast et al. |
| 5,784,328 | A | 7/1998 | Irrinki et al. |
| 6,438,057 | B1* | 8/2002 | Ruckerbauer ................. 365/222 |
| 6,772,352 | B1 | 8/2004 | Williams et al. |
| 6,813,210 | B2 | 11/2004 | Okamoto et al. |
| 7,196,956 | B2 | 3/2007 | Shirota et al. |

(Continued)

FOREIGN PATENT DOCUMENTS

| JP | 08-287676 | 11/1996 |
| KR | 10-2004-0103017 A | 12/2004 |

OTHER PUBLICATIONS

Kim at al. "CMOS Temperature Sensor with Ring Oscillator for Mobile DRAM Self-refresh Control", IEEE 2008, pp. 3094-3097, authors from Sungkyunkwan University and/or Samsung Electronics Co., Ltd.; Korea.

*Primary Examiner* — Jason Lappas
(74) *Attorney, Agent, or Firm* — Myers Bigel Sibley & Sajovec, P.A.

(57) ABSTRACT

An integrated circuit memory device includes a refresh control circuit that generates an internal memory refresh command signal having a period that is changed relative to a period of an external memory refresh command signal received by the memory device. This change in the period of the internal memory refresh command may be in response to detecting a change in temperature of the memory device. In particular, the refresh control circuit is configured so that the period of the internal memory refresh command signal is increased in response to detecting a reduction in temperature of the memory device.

10 Claims, 10 Drawing Sheets

(56) References Cited

U.S. PATENT DOCUMENTS

| | | |
|---|---|---|
| 7,206,244 B2 | 4/2007 | Cruz et al. |
| 7,233,538 B1 | 6/2007 | Wu et al. |
| 7,248,526 B2 | 7/2007 | Ito et al. |
| 7,286,377 B1 | 10/2007 | Pyeon |
| 7,295,484 B2 | 11/2007 | Cruz et al. |
| 7,499,359 B2 | 3/2009 | Choi et al. |
| 7,580,303 B2 | 8/2009 | Nishimura et al. |
| 2005/0105367 A1 | 5/2005 | Kim et al. |
| 2006/0002217 A1 | 1/2006 | Walker et al. |
| 2006/0083094 A1 | 4/2006 | Sinha et al. |
| 2006/0085616 A1 | 4/2006 | Zeighami et al. |

* cited by examiner

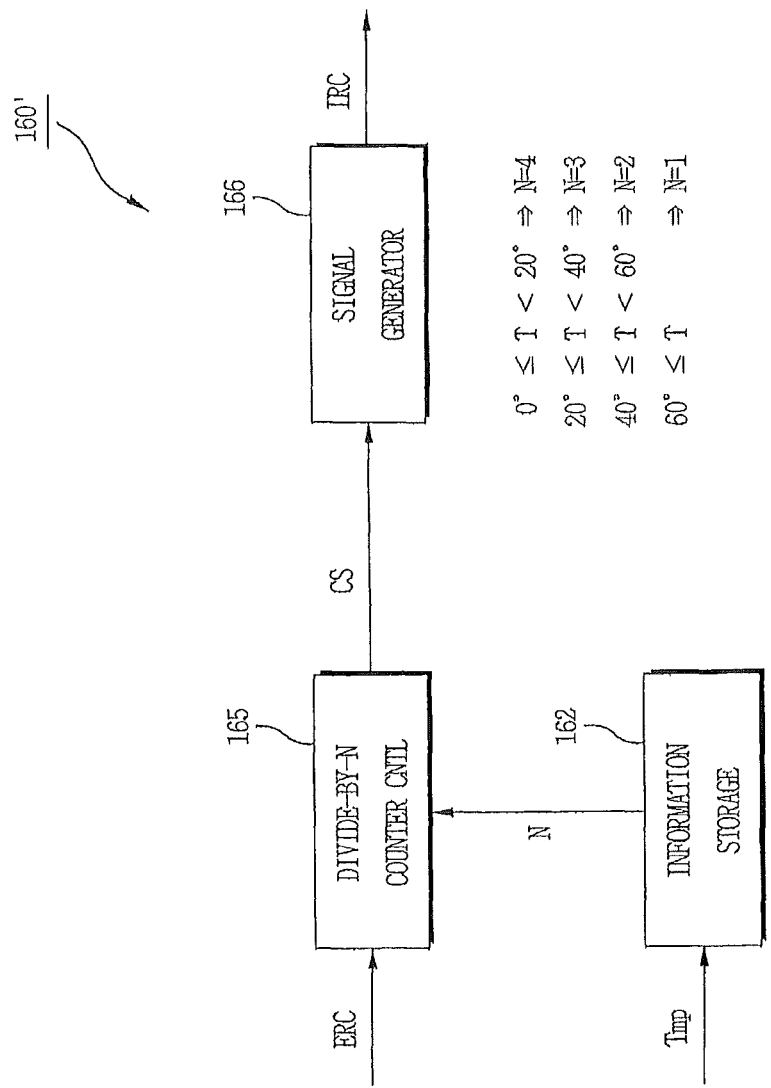

METHODS OF OPERATING DRAM DEVICES HAVING ADJUSTABLE INTERNAL REFRESH CYCLES THAT VARY IN RESPONSE TO ON-CHIP TEMPERATURE CHANGES

CROSS-REFERENCE TO RELATED APPLICATIONS

This application is a continuation of and claims priority from U.S. patent application Ser. No. 13/471,592, filed May 15, 2012, which claims priority from U.S. Pat. No. 8,218,137, issued Jul. 10, 2012, which claims priority from U.S. Pat. No. 7,843,752, issued Nov. 30, 2010, which claims priority from Korean Patent Application No. 10-2007-0041735, filed Apr. 30, 2007, the contents of which are hereby incorporated herein by reference.

FIELD

The present invention relates to semiconductor memory devices and, more particularly, to memory devices that undergo refresh operations to preserve volatile data.

BACKGROUND

Dynamic random access memory (DRAM) devices are frequently used in memory applications requiring high capacity storage and high data bandwidth during write and read operations. A conventional DRAM device includes a bank of memory cells arranged as a plurality of rows and columns of memory cells that are connected to word lines and bit lines, respectively. Each memory cell may be configured to include an access transistor and a storage capacitor configured to retain binary data ("1" or "0") therein as stored charge. The access transistor typically includes a gate electrode, which is connected to a respective word line, a source terminal, which is electrically connected to a respective bit line and a drain terminal, which is electrically connected to an electrode (e.g., lower electrode) of the storage capacitor.

Unfortunately, the data stored within a storage capacitor of a DRAM cell is treated as "volatile" data that may, as a result of charge leakage from the storage capacitor, degrade even when power to the DRAM device is not interrupted. In order to prevent this degradation of data from causing data errors, the data in each memory cell of a DRAM device is periodically "refreshed." Accordingly, if a DRAM cell is storing a data "1" value as stored charge within a respective storage capacitor, then a data "1" value may be periodically read from the cell and then immediately rewritten back into the cell at full value in order to replenish the charge in the storage capacitor. This replenishment of charge in the storage capacitor operates as a "refresh" of the data retained by the DRAM cell. However, in the event the frequency at which a bank of DRAM cells is refreshed becomes too high, then the performance of the DRAM device may suffer and thereby limit the number of write and read operations that may be performed within the DRAM.

FIG. 1 is a graph illustrating two curves G11 and G13 as a function of DRAM device temperature (° C.). The first curve G11, which is associated with a vertical axis on the right side of the graph, illustrates the value of storage capacitor leakage current (ICC6) within a core of a DRAM device as a function of DRAM device temperature. As illustrated by G11, the storage capacitor leakage current increases from 25 uA to 900 uA as a function of temperature in a range between 6° C. and 125° C. The second curve G13, which is associated with a vertical axis on the left side of the graph, illustrates a period of an external refresh command signal (CMD) as a function of temperature. As illustrated by G13, the period of the external refresh command signal decreases from a maximum of 3 seconds to a minimum of 80 ms as the temperature of the DRAM device increases. This decrease in the length of the refresh period must be sufficient to account for the higher leakage currents that are present at higher temperatures in order to maintain data reliability.

FIG. 2 is a block diagram of a conventional memory system, which includes a memory controller 14 and a high capacity DRAM device 10. The DRAM device 10 is illustrated as including a temperature sensor 12, which measures the temperature of the DRAM device 10. In particular, the temperature sensor 12 generates a temperature signal Tmp that is provided to the memory controller 14. In response, the memory controller 14 determines, based on a relationship such as shown by FIG. 1, the appropriate frequency of an external refresh command CMD provided to the DRAM device 10. In this manner, the memory controller 14 may control the timing of refresh operations performed within the DRAM device 10 in order to prevent data errors caused by storage capacitor leakage.

SUMMARY

An integrated circuit memory device according to an embodiment of the present invention includes a refresh control circuit configured to generate an internal memory refresh command signal in response to an external memory refresh command signal. In particular, the refresh control circuit is configured to change the period of the internal memory refresh command signal relative to the period of the external memory refresh command signal, in response to detecting a change in temperature of the memory device. More specifically, the refresh control circuit is configured to generate an internal memory refresh command signal having a period that is increased relative to the period of the external memory refresh command signal when a reduction in temperature of the memory device is detected.

According to some of these embodiments, the refresh control circuit may include a temperature information storage device. This temperature information storage device is configured to generate a first signal having a value that is changed in response to a first change in temperature of the memory device. The refresh control circuit may also include a counter that is configured to generate a second signal in response to the external memory refresh command signal. In addition, a comparator may be provided that is responsive to the first and second signals. This comparator is configured to generate a comparison signal having a value that identifies when the first and second signals are equivalent. The refresh control circuit may also include a refresh command signal generator that is configured to generate the internal memory refresh command signal in response to the comparison signal.

According to some of these embodiments of the invention, the internal memory refresh command signal may be a pulse train having a non-uniform duty cycle. Moreover, the leading edges of the pulses in the pulse train may be synchronized with respective changes in the comparison signal that reflect an equivalency between the first and second signals (i.e., each pulse may be generated upon detection of the equivalency). Furthermore, in some of the embodiments of the invention, the counter is configured to generate the second signal as a repeating sequence of count values that change in-sync with leading edges of the external memory refresh command signal.

According to alternative embodiments of the invention, the refresh control circuit may include a refresh command signal generator that is configured to generate at least a first refresh command signal having a period N times greater than a period of the external memory refresh command signal, where N is an integer greater than one. In these embodiments, the refresh control circuit may include a multiplexer having a first data input configured to receive the external memory refresh command signal and a second data input configured to receive the first refresh command signal. A temperature sensor may also be provided that is configured to measure a temperature of the memory device and a control input (e.g., select input) of the multiplexer may be configured to receive an output of the temperature sensor.

BRIEF DESCRIPTION OF THE DRAWINGS

The present invention will become more fully understood from the detailed description given hereinbelow and the accompanying drawings, which are given by way of illustration only, and thus are not limitative of the present invention.

FIG. 10 is a block diagram of a control unit according to another embodiment of the present invention.

DETAILED DESCRIPTION OF PREFERRED EMBODIMENTS OF THE INVENTION

Embodiments of the present invention now will be described more fully hereinafter with reference to FIGS. 3 to 10, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
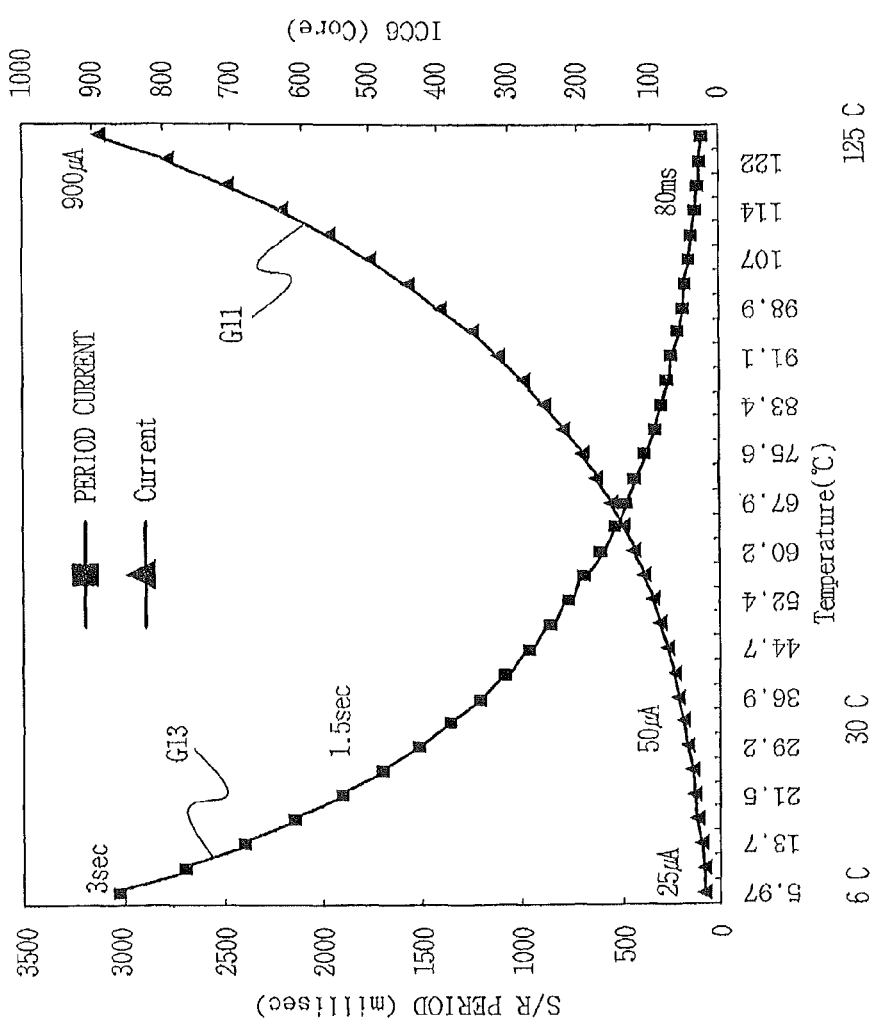
FIG. 1 is a graph illustrating a refresh period and leakage current based on an internal temperature of semiconductor memory device according to conventional devices.
Figure 2:
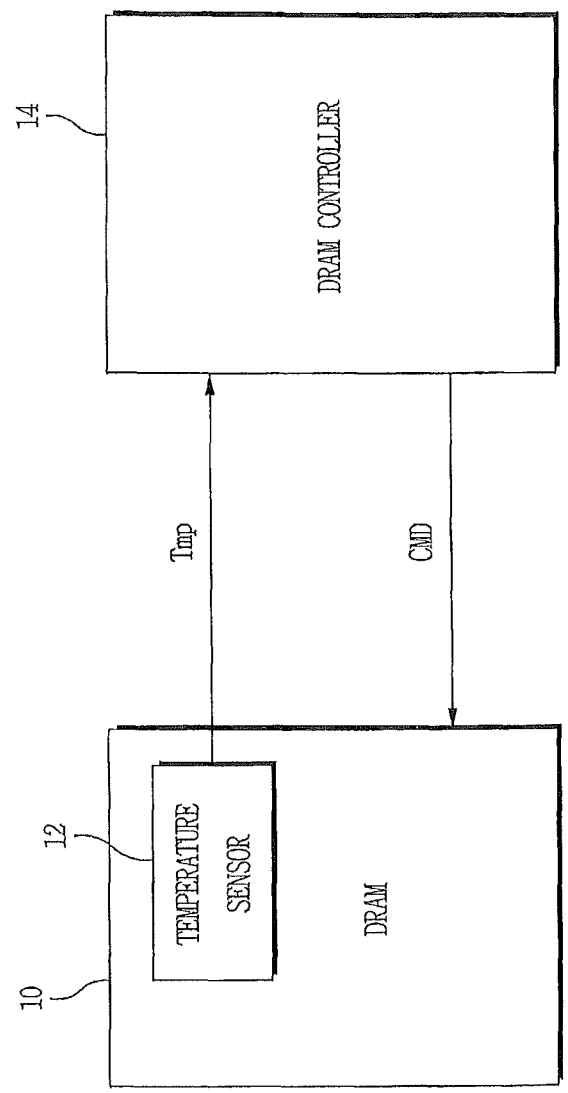
FIG. 2 is a block diagram of a conventional memory system.
Figure 3:
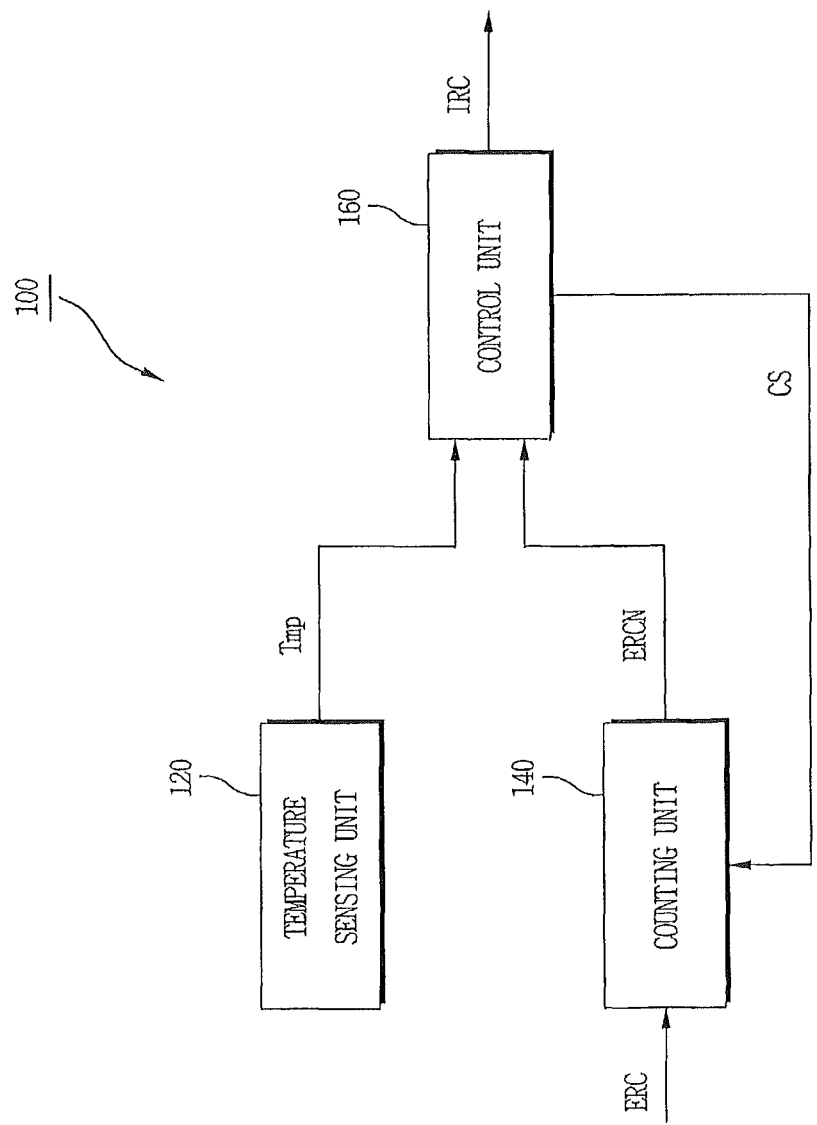
FIG. 3 is a block diagram of an internal refresh period control circuit in a semiconductor memory device, according to one embodiment of the invention.

FIG. 3 is a block diagram of an internal refresh period control circuit 100 in a semiconductor memory device, according to one embodiment of the invention. Referring to FIG. 3, a refresh period control circuit 100 includes a temperature sensing unit 120, an external refresh command counting unit 140 and a control unit 160, which generates an internal refresh command signal IRC and feeds back a comparison signal CS to a reset input of the counting unit 140. The temperature-sensing unit 120 includes a temperature sensor in the interior thereof, which measures an internal temperature of the semiconductor memory device, and outputs temperature information Tmp to the control unit 160. The counting unit 140 includes a counter in the interior thereof, and receives an external refresh command signal ERC generated external to the memory device. The counting unit counts how many times the external refresh command ERC is input (in a repeating count cycle that resets) and outputs the counted number ERCN to the control unit 160. The control unit 160 receives the temperature information Tmp from the temperature sensing unit 120 and the counted number ERCN from the counting unit 140 and generates the internal command signal IRC.

Figure 4:
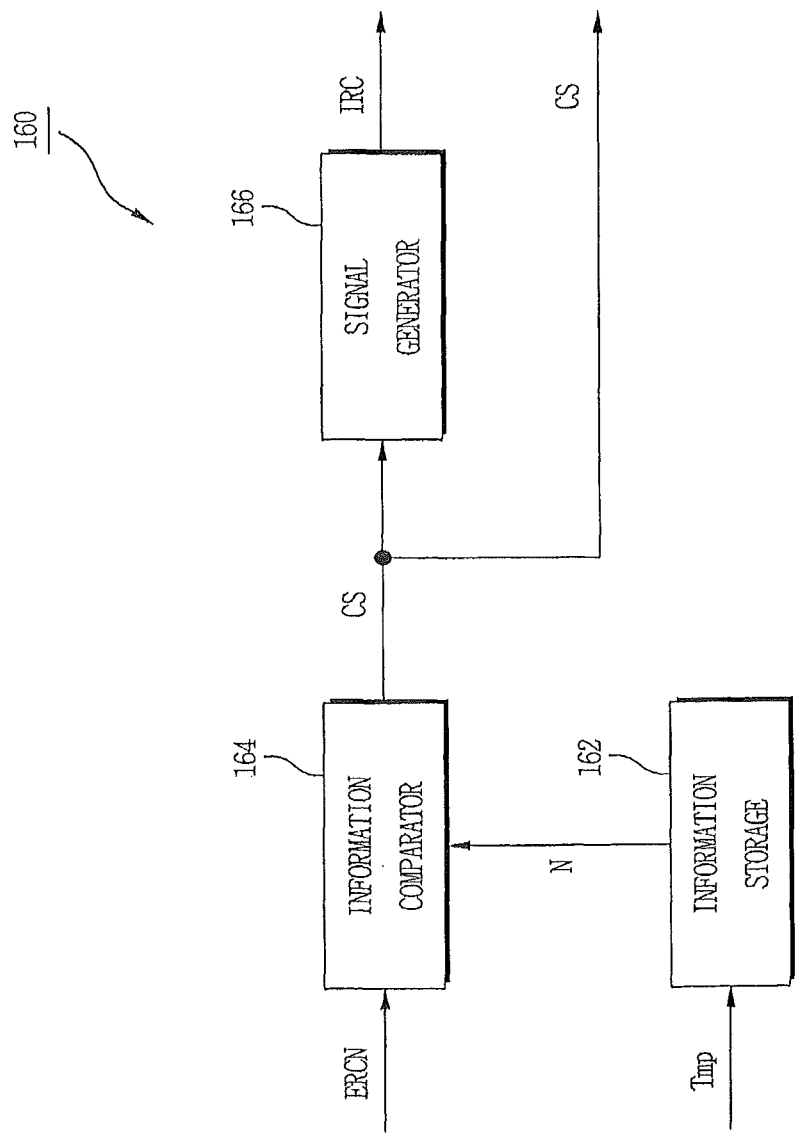
FIG. 4 is a block diagram of a control unit in the internal refresh period control circuit shown in FIG. 3.

FIG. 4 is a block diagram illustrating components of a control unit 160 that may be used in the refresh period control circuit shown in FIG. 3. As shown in FIG. 4, the control unit 160 includes an information storage device 162, an information comparator 164, and a signal generator 166. The information storage device 162 divides an internal temperature into temperature intervals according to a change in internal measured-temperatures Tmp of the semiconductor memory device, and stores a number based on each temperature interval. In particular, when receiving the measured temperature Tmp from the temperature-sensing unit 120, the information storage device 162 outputs a number N corresponding to the stored measured-temperature Tmp.

For example, an internal temperature of the semiconductor memory device may be divided into intervals of 0° C.~20° C., 20° C.~40° C., 40° C.~60° C. and more than 60° C. In these respective intervals, the interval of 0° C.~20° C. is stored with "four" for the number N, the interval of 20° C.~40° C. with "three" for the number N, the interval of 40° C.~60° C. with "two" for the number N, and the interval of more than 60° C. with "one" for the number N in the information storage device 162. The ranges of the temperature intervals and the numbers N may be varied. The number N is appropriately determined through an experience so that data is prevented from being damaged. The information storage device 162 may store the number N in an internal register.

The information comparator 164 receives the counted number ERCN from the counting unit 140. The information comparator 164 compares the counted number ERCN with the number N read from the information storage device 162, and determines whether the numbers are equal to each other. When the counted number ERCN and the number N are equal, the information comparator 164 generates a valid comparison signal CS and outputs it to the signal generator 166. However, when the counted number ERCN and the number N are different from each other, the counted number ERCN is disregarded until it becomes equal to N. During this time, the external refresh commands ERC are continuously counted, and a counted number ERCN is incremented (in a repeating count cycle that is reset to zero when a maximum count is reached).

The signal generator 166 outputs an internal refresh command IRC for a refresh operation of the semiconductor memory device when a valid comparison signal CS is received from the information comparator 164. At this time, the internal refresh command IRC may have a period different from a period of the external refresh command ERC that is received by the counting unit 140.

An alternative control unit 160' is illustrated by FIG. 10. In particular, FIG. 10 illustrates a control unit 160' containing an information storage device 162, a divide-by-N counter 165 and a signal generator 166. The information storage device 162 and signal generator 166 may be equivalent to those illustrated by FIG. 4. The divide-by-N counter 165 generates a signal CS as a pulse train that is a divide-by-N version of the external refresh command ERC, where N is the number determined through an experience and stored in the information storage device 162 and corresponds to a temperature signal Tmp. In particular, if N=1, then CS is equivalent to ERC and if N=2, then CS has half the frequency of ERC. Likewise, if N=3, then CS is a periodic signal having one-third the frequency of ERC and if N=4, then CS is a periodic signal having one-fourth the frequency of ERC.

Figure 5:
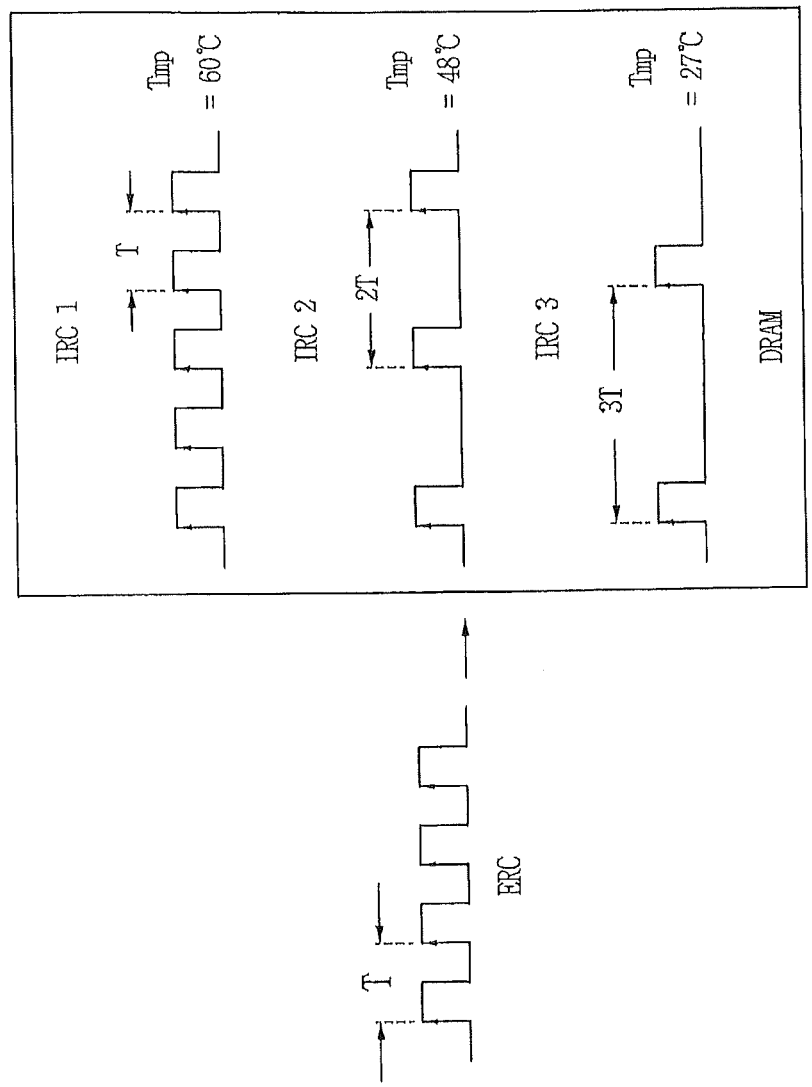
FIG. 5 illustrates timings for operations of the internal refresh command shown in FIG. 3.

As shown in FIG. 5, when an external refresh command signal ERC having a constant period is applied to a DRAM, internal refresh commands IRC1, IRC2 and IRC3 having different refresh periods based on the DRAM internal temperature Tmp may be generated. For example, when the DRAM internal temperature Tmp is 60° C. and the external refresh command ERC having a constant period is input from the outside to the DRAM, an internal refresh command IRC1 has the same period as the external refresh command ERC because N=1. Thus, when the external refresh command ERC is received during a time when the internal operating temperature Tmp of the semiconductor memory device is high (e.g., when the internal temperature of DRAM is 60° C. or higher), the internal refresh command IRC1 having the same period as the external refresh command ERC is produced.

Alternatively, when the internal temperature Tmp of the semiconductor memory device is 48° C., for example, an internal refresh command IRC2 having a period longer than the internal refresh command IRC1, is generated, which indicates that a refresh operation generation time has a relatively longer interval.

Furthermore, when the internal temperature Tmp of the semiconductor memory device is 27° C., for example, a generated internal refresh command IRC3 has a period longer than the internal refresh commands IRC1 and IRC2. Thus, a refresh generation frequency of the semiconductor memory device is greater than when the internal temperature is relatively high.

Figure 6:
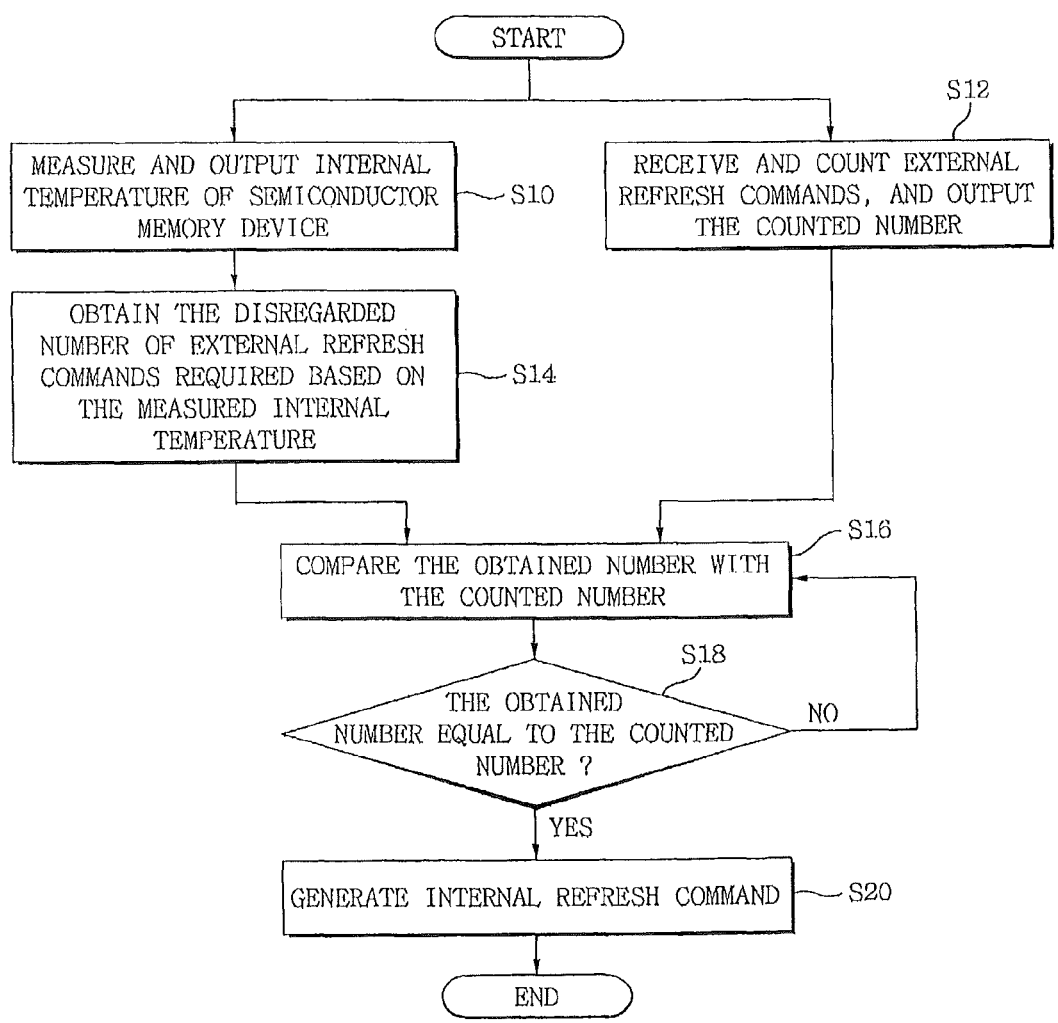
FIG. 6 is a flowchart of operations that may be performed in the control circuit of FIG. 3.

FIG. 6 is a flowchart that illustrates operations performed by the refresh period control circuit shown in FIG. 3. With reference to FIG. 6, an internal temperature of the semiconductor memory device is first measured (step S10), and external refresh commands received from the outside are counted and the counted number is generated (step S12). A number of external refresh commands corresponding to the measured internal temperature is then read from the information storage device (step S14).

The determined number and the counted number are then compared (step S16), to determine whether an equality or inequality exists between the two numbers (step S18). If an equality exists, then an internal refresh command is generated (step S20). However, if an inequality is present, then comparing the determined number with an updated counted number is again performed.

Figure 7:
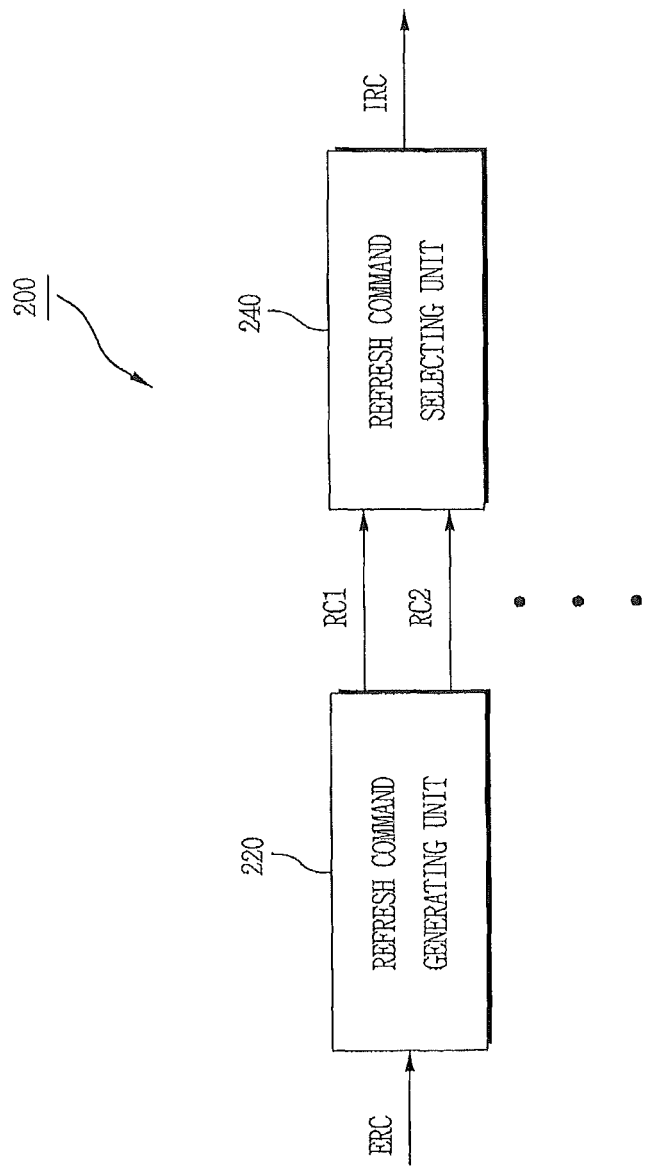
FIG. 7 is a block diagram of an internal refresh period control circuit, according to another embodiment of the invention.

FIG. 7 is a block diagram of internal refresh period control circuit in a semiconductor memory device according to another embodiment of the invention. As shown in FIG. 7, the refresh period control circuit 200 comprises a refresh command generating unit 220 and a refresh command selection unit 240. The refresh command generating unit 220 includes at least one period converter in the interior thereof, and converts the external refresh command ERC into a plurality of refresh commands RC1, RC2 . . . having a period that is the same as or different from the external refresh command ERC, by using the period converter. The period converter is herein constructed of a D-type flip-flop. The refresh command selection unit 240 receives a plurality of refresh commands RC1, RC2 . . . output through the refresh command generating unit 220, and selects one refresh command among them, and outputs it as an internal refresh command IRC.

Figure 8:
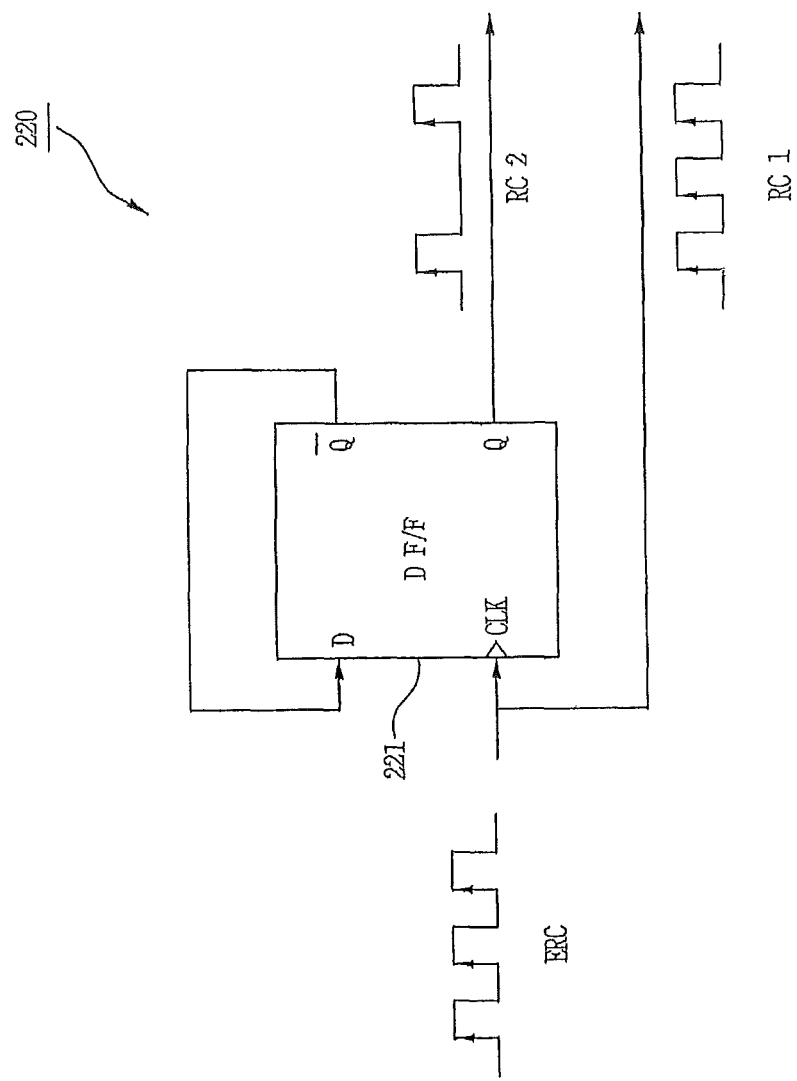
FIG. 8 illustrates an internal structure of the refresh command generating unit shown in FIG. 7.

The refresh command generating unit is described in detail, as follows, with reference to FIG. 8. In particular, FIG. 8 illustrates an internal structure of refresh command generating unit shown in FIG. 7. As shown in FIG. 8, the refresh command generating unit 220 includes at least one D flip-flop 221. External refresh command ERC is input to a clock port CLK of the D flip-flop 221 from the outside, and is output with the same period as the input state to the outside through a first output terminal Q of the D flip-flop 221. At this time, a signal having a value different from the external refresh command ERC is output through a second output terminal /Q.

For example, when data '1' is applied to clock port CLK of the D flip-flop 221, the data '1' is output through first output terminal Q of the D flip-flop 221. At this time, data '0' different from the data '1' input to the clock port CLK is output through second output terminal /Q of the D flip-flop 221, and are input to a data input port D. Then, the data '0' input to the data input port D is again output to the first output terminal Q, and the above-mentioned operation repeats.

Therefore, the first refresh command RC1 having a period different from the external refresh command ERC, and second refresh command RC2 having a period equal to the external refresh command ERC, are generated. The refresh command generating unit 220 outputs the plurality of converted refresh commands RC1, RC2 . . . to the refresh command selection unit 240.

At this time, the refresh command generating unit 220 may include a plurality of D flip-flops 221 so as to produce a plurality of refresh commands RC1, RC2 . . . .

Figure 9:
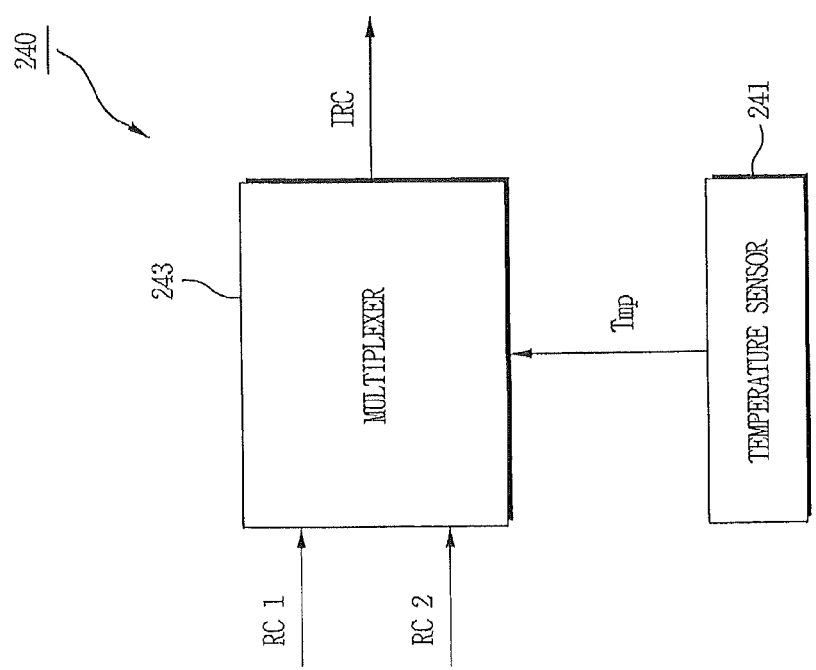
FIG. 9 illustrates an internal structure of the refresh command selection unit shown in FIG. 7.

Referring to FIG. 9, the refresh command selection unit 240 is described in detail, as follows. In particular, FIG. 9 illustrates an internal structure of the refresh command selection unit shown in FIG. 7. As shown in FIG. 9, the refresh command selection unit 240 includes at least one temperature sensor 241 and at least one multiplexer 243. The temperature sensor 241 measures an internal temperature of the semiconductor memory device, and transmits the measured temperature Tmp to the multiplexer 243.

The multiplexer 243 receives the plurality of refresh commands RC1, RC2 . . . output through the refresh command generating unit 220, and then selects one refresh command among the commands according to the transmitted measured-temperature Tmp, and outputs it as a final internal refresh command IRC. Accordingly, without depending upon the external refresh command, an internal refresh command having a refresh period changed by a measured internal temperature of the semiconductor memory device can be produced.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A memory system comprising:
   a memory controller configured to generate an external refresh command having a first time interval; and a semiconductor memory device configured to generate an internal refresh command based on the external refresh command and an internal temperature, wherein the semiconductor memory device is a dynamic random access memory (DRAM) device, wherein the internal refresh command is configured to have a second time interval at a first temperature and a third time interval at a second temperature, wherein the second and third time intervals are different.

2. The memory system of claim 1, wherein the semiconductor memory device comprises:

a temperature sensing unit configured to output a measured internal temperature of the semiconductor memory device;

a counting unit configured to count a number of external refresh commands repeatedly input at every determined time interval and output the counted number; and a control unit configured to generate the internal refresh command based on the measured internal temperature output from the temperature sensing unit and the counted number output from the counting unit.

3. The memory system of claim 2, wherein the control unit is configured to be controlled to disregard an external refresh command that is input within a time interval from a generation of one internal refresh command to a generation of a subsequent internal refresh command.

4. The memory system of claim 3, wherein the control unit comprises:

an information storage configured to store a disregarded number of external refresh commands based on a temperature interval, and output the disregarded number corresponding to the measured internal temperature;

an information comparator configured to compare the counted number of external refresh commands output from the counting unit, with the disregarded number output from the information storage, and output a clarification signal when the counted number is equal to or greater than the disregarded number; and a signal generator configured to generate an internal refresh command in response to the clarification signal.

5. The memory system of claim 4, wherein the information storage is configured to classify an internal temperature into temperature intervals according to an internal temperature change of the semiconductor memory device, and store the disregarded number of the external refresh commands based on each temperature interval, and receive the measured internal temperature from the temperature sensing unit to output the disregarded number of external refresh commands corresponding to the measured internal temperature to the information comparator.

6. The memory system of claim 4, wherein when the disregarded number and the counted number are not equal to each other, the information comparator is configured to disregard the counted number until the disregarded number and the counted number become equal, and control a generation of the clarification signal.

7. A method of controlling a refresh time interval in a semiconductor memory device, the method comprising:

generating an external refresh command having a first time interval; and generating an internal refresh command based on the external refresh command and an internal temperature, the internal refresh command having a second time interval at a first temperature and a third time interval at a second temperature, wherein the semiconductor memory device is a dynamic random access memory (DRAM) device, and wherein the second and third time intervals are different.

8. The method of claim 7, wherein generating the internal refresh command comprises:

outputting a measured internal temperature of the semiconductor memory device;

outputting a counted number obtained by counting a number of input external refresh commands;

comparing a disregarded number of predetermined external refresh commands based on a temperature interval and the counted number of the external refresh commands when the measured internal temperature is included in the temperature interval; and generating the internal refresh command based on a result of the comparing.

9. The method of claim 8, wherein generating the internal refresh command comprises:

generating the internal refresh command in response to an external refresh command when the disregarded number and the counted number are equal; and preventing a generation of the internal refresh command when the disregarded number and the counted number are unequal.

10. The method of claim 9, wherein the disregarded number of external refresh commands based on a temperature interval is configured to increase as the measured internal temperature becomes lower.

* * * * *